(12) United States Patent
Delgadino et al.

(10) Patent No.: US 7,132,369 B2
(45) Date of Patent: Nov. 7, 2006

(54) METHOD OF FORMING A LOW-K DUAL DAMASCENE INTERCONNECT STRUCTURE

(75) Inventors: Gerardo A. Delgadino, Santa Clara, CA (US); Yan Ye, Saratoga, CA (US); Neungho Shin, San Jose, CA (US); Yunsang Kim, San Jose, CA (US); Li-Qun Xia, Santa Clara, CA (US); Tzu-Fang Huang, San Jose, CA (US); Lihua Li, San Jose, CA (US); Joey Chiu, Chung-Li (TW); Xiaoye Zhao, Mountain View, CA (US); Fang Tian, Fremont, CA (US); Wen Zhu, Sunnyvale, CA (US); Ellie Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 232 days.

(21) Appl. No.: 10/745,344

(22) Filed: Dec. 22, 2003

(65) Prior Publication Data

US 2004/0157453 A1   Aug. 12, 2004

Related U.S. Application Data

(60) Provisional application No. 60/437,472, filed on Dec. 31, 2002.

(51) Int. Cl.
*H01L 21/302* (2006.01)

(52) U.S. Cl. .................. 438/723; 438/700; 438/738

(58) Field of Classification Search ............... 438/672, 438/675, 700, 723, 724, 725, 734, 735, 738, 438/740, 743, 744
See application file for complete search history.

(56) References Cited

U.S. PATENT DOCUMENTS

| | | | |
|---|---|---|---|
| 5,950,106 A | | 9/1999 | May et al. |
| 6,042,999 A | * | 3/2000 | Lin et al. ................. 430/316 |
| 6,077,764 A | * | 6/2000 | Sugiarto et al. ........... 438/597 |
| 6,114,259 A | * | 9/2000 | Sukharev et al. .......... 438/789 |
| 6,140,226 A | | 10/2000 | Grill et al. |
| 6,147,009 A | | 11/2000 | Grill et al. |
| 6,350,700 B1 | * | 2/2002 | Schinella et al. .......... 438/723 |
| 6,383,907 B1 | * | 5/2002 | Hasegawa et al. .......... 438/597 |
| 6,503,840 B1 | * | 1/2003 | Catabay et al. ............ 438/694 |
| 6,656,837 B1 | * | 12/2003 | Xu et al. ................. 438/676 |
| 6,930,056 B1 | * | 8/2005 | Catabay et al. ............ 438/778 |
| 2002/0102856 A1 | | 8/2002 | Xia et al. |
| 2002/0187627 A1 | | 12/2002 | Yuang |

(Continued)

OTHER PUBLICATIONS

Copy of International Search Report dated Jul. 9, 2004 from corresponding PCT application, PCT/US03/41145.

*Primary Examiner*—Kin-Chan Chen
(74) *Attorney, Agent, or Firm*—Moser IP Law Group

(57) ABSTRACT

A method of fabricating an interconnect structure comprising etching a via into an upper low K dielectric layer and into a hardened portion of a lower low K dielectric layer. The via is defined by a pattern formed in a photoresist layer. The photoresist layer is then stripped, and a trench that circumscribes the via as defined by a hard mask is etched into the upper low K dielectric layer and, simultaneously, the via that was etched into the hardened portion of the lower low K dielectric layer is further etched into the lower low K dielectric layer. The result is a low K dielectric dual damascene structure.

34 Claims, 7 Drawing Sheets

U.S. PATENT DOCUMENTS

2003/0068881 A1    4/2003  Xia et al.
2003/0129827 A1*   7/2003  Lee et al. .................. 438/629
2003/0207594 A1*  11/2003  Catabay et al. ............ 438/778
2004/0106278 A1*   6/2004  Xu et al. ..................... 438/637
2004/0219794 A1*  11/2004  Buchanan et al. .......... 438/706
2005/0064698 A1*   3/2005  Chang et al. ............... 438/623

* cited by examiner

METHOD OF FORMING A LOW-K DUAL DAMASCENE INTERCONNECT STRUCTURE

CROSS-REFERENCE TO RELATED APPLICATIONS

This application claims benefit of U.S. provisional patent application Ser. No. 60/437,472, filed Dec. 31, 2002, which is herein incorporated by reference.

BACKGROUND OF THE INVENTION

1. Field of the Invention

The present invention generally relates to a damascene structures for integrated circuits and, more particularly, to a method of forming a dual damascene structure comprising dielectric materials having low dielectric constants (low K).

2. Description of the Related Art

Integrated circuits have evolved into complex devices that can include millions of components (e. g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e. g., sub-micron dimensions), the materials used to fabricate such components contribute to their electrical performance. For example, low resistivity metal interconnects (e. g., copper and aluminum) provide conductive paths between the components on integrated circuits.

Copper is particularly advantageous for use in interconnect structures due to its desirable electrical properties. Copper interconnect systems are typically fabricated using a damascene process in which trenches and vias are etched into dielectric layers. The trenches and vias are filled with copper, which is then planarized using, for example, a chemical-mechanical planarization (CMP) process.

Copper interconnects are electrically isolated from each other by an insulating material. When the distance between adjacent metal interconnects and/or the thickness of the insulating material has sub-micron dimensions, capacitive coupling potentially occurs between such interconnects. Capacitive coupling between adjacent metal interconnects may cause cross talk and/or resistance-capacitance (RC) delay which degrades the overall performance of the integrated circuit. In order to reduce capacitive coupling between adjacent metal interconnects, low dielectric constant (low k) insulating materials (e. g., dielectric constants less than about 4.0) are needed.

Unfortunately, low K dielectric materials are not easy to process using damascene and dual damascene techniques. In particular, low K dielectric materials are susceptible to damage during plasma processing, such as plasma etching used to strip photoresist layers after the low K dielectric layer has been etched. Furthermore, low K dielectrics are prone to have adhesion problems, i.e., the low K materials do not effectively adhere to underlying layers.

In the prior art, dual damascene structures are formed in a film stack comprising a copper contact, a passivation layer, a first low K dielectric layer, a dielectric cap layer, and a second low K dielectric layer. A hard mask is deposited and patterned using a photoresist to define a via location. The hard mask is used to etch a via into the second dielectric layer down to the dielectric cap layer. A second photoresist patterning process is performed to define a trench pattern in the hard mask. During the patterning process the cap layer is removed from the bottom of the via. Next, the second low K dielectric layer is etched to form a trench, while simultaneously, the via is extended through the first low K dielectric layer down to the passivation layer. The cap layer protects the first low K dielectric from etching at the bottom of the trench and forms a mask for the via. The passivation layer at the bottom of the via and the cap layer at the bottom of the trench are then removed. Lastly, the trench and via are filled with metal, e.g., copper, to complete the dual damascene structure.

The process of the prior art is fraught with difficulties. The use of a cap layer to protect the low K dielectric during trench etch complicates the process by requiring additional deposition and etch processing. Furthermore, the process requires two photoresist or hard mask patterning steps. Also, it is difficult to find suitable etch stop layers and hard mask layers that have both good etch selectivity with respect to the low K dielectric layer and sufficiently low dielectric constants themselves. Furthermore, it is difficult to achieve these goals without creating a process that is overly complex or requires the use of numerous processing chambers.

Therefore, a need exists in the art for simplified methods of accurately fabricating low K damascene structures.

SUMMARY OF THE INVENTION

The present invention generally relates to a method of etching a low K dielectric material and, in particular, to the formation of low K dielectric dual damascene interconnect structures. A method of etching a low K dielectric material comprises hardening a portion of a low K dielectric, then etching non-hardened portions of the material. The invention further includes a method of fabricating an interconnect structure comprising etching a via into an upper low K dielectric layer and into a hardened portion of a lower low K dielectric layer. The via is defined by a pattern formed in a photoresist layer. The photoresist layer is then stripped, and a trench that circumscribes the via as defined by a hard mask is etched into the upper low K dielectric layer and, simultaneously, the via that was etched into the hardened portion of the lower low K dielectric layer is further etched into the lower low K dielectric layer. The result is a low K dielectric dual damascene structure. Alternatively, a mask etching step may be provided between the first via etch and the trench etch. The mask etching step is used to correct any misalignment of the trench and via patterns. Furthermore, in another embodiment of the invention, adhesion of the structure is improved by plasma treating a low K barrier layer prior to depositing the low K dielectric material upon the low K barrier layer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

The present invention relates to a method of etching a low K dielectric material and, in particular, to fabricating a dual damascene interconnect structure comprising dielectric materials having lower dielectric constants (low K). The structure is formed by etching a via in an upper low K dielectric layer and into a hardened portion of a lower low K dielectric layer, then simultaneously etch a trench in the upper low K dielectric layer and a via in the lower low K dielectric layer. The hardened portion forms a mask for the via and a hard mask forms a mask for the trench. In one embodiment, adhesion of the structure to underlying layer(s) is improved by plasma treating a barrier layer for the structure.

Figure 1:
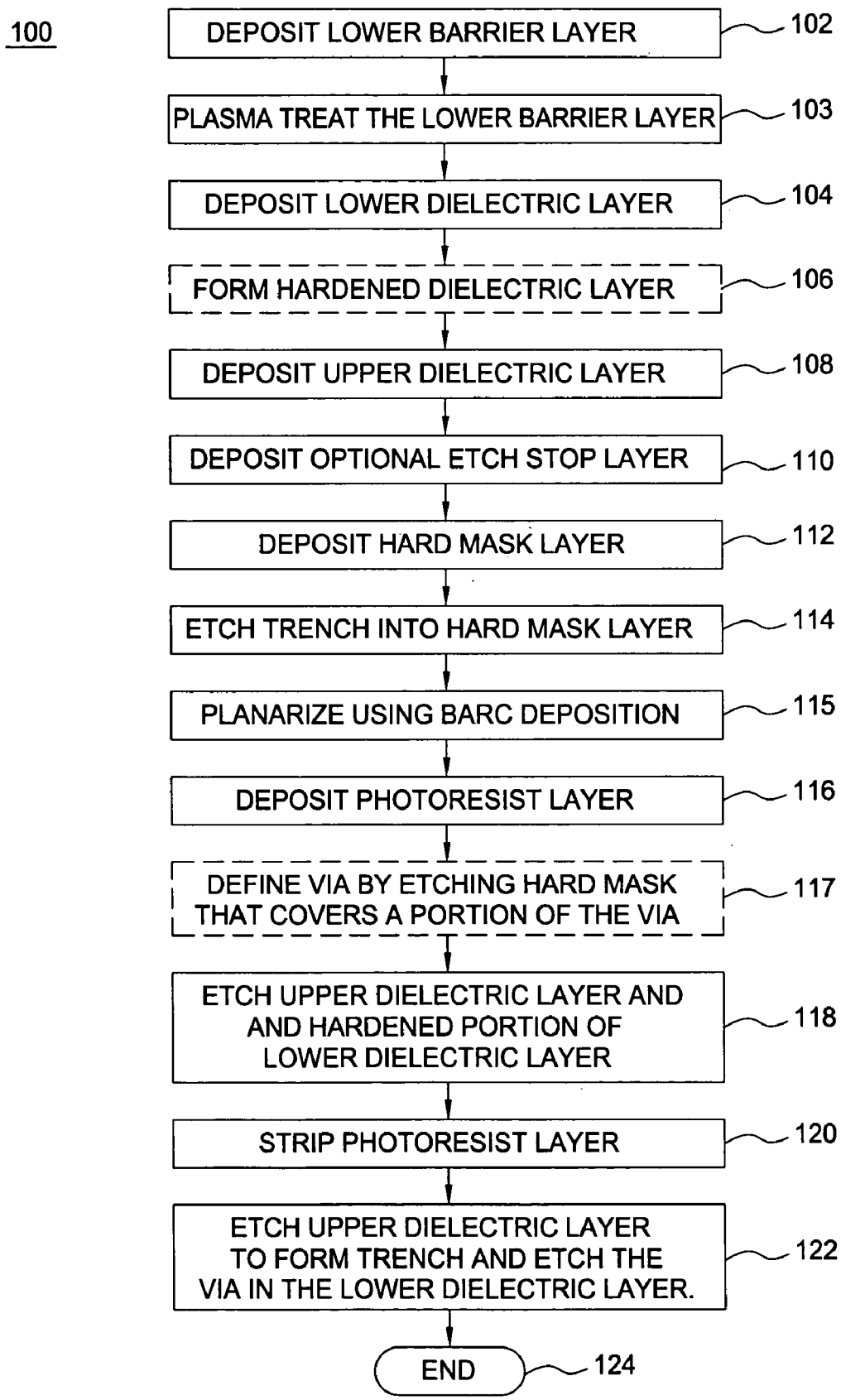
FIG. 1 depicts a sequence of method steps for forming a low-K dual damascene structure according to one embodiment of the invention described herein.

FIG. 1 depicts a sequence 100 of method steps that may be used to form a low-K dual damascene structure according to one embodiment of the invention. The sequence 100 comprises depositing a lower barrier layer on a substrate (step 102), plasma treating the lower barrier layer (step 103), depositing a lower low K dielectric layer on the lower barrier layer (step 104), forming a hardened low K dielectric portion of the lower low K dielectric layer (step 106), depositing an upper low K dielectric layer on the hardened dielectric layer (step 108), depositing an optional etch stop layer (step 110) and depositing a hard mask layer on the upper dielectric layer (step 112).

A trench is then etched into the hard mask layer (step 114) to form a trench pattern for subsequently etching the upper dielectric layer. A bottom anti-reflective coating is deposited over the hard mask to planarize the surface (step 115). A photoresist layer is formed on the BARC layer (step 116). The photoresist layer defines a pattern for a via that is aligned within the trench. If the hard mask is misaligned, such that the mask covers a portion of the location for the via, an additional etch step (step 117) may be used to remove a portion of the hard mask that covers the via location. The upper dielectric layer is etched to extend the via through the upper dielectric layer (step 118) and into the hardened portion of the lower low K dielectric layer. The photoresist layer and BARC layer are then stripped (step 120). The upper low K dielectric layer is etched to form the trench in the upper low K dielectric layer (step 122). This extension of the trench removes the damaged surface region of the upper dielectric layer that has been damaged by the stripping of the photoresist layer. Simultaneous with etching the trench, the via that was formed in the hardened portion of the lower low K dielectric layer is etched through the lower low K dielectric layer. The method ends with step 124.

Figure 2A:
FIGS. 2A–2Q are cross-sectional views of a substrate during different stages of a dual damascene interconnect processing sequence consistent with one example of an inventive treatment described herein.
Figure 2B:
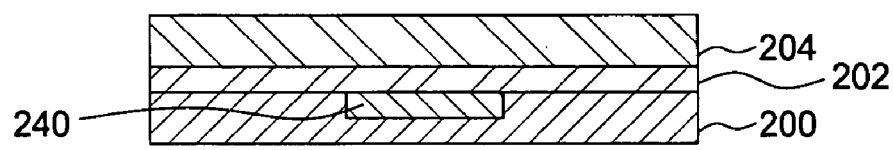

The invention will now be discussed in detail with respect to FIGS. 2A–2Q. FIGS. 2A–2Q are cross-sectional views of substrate 200 during different stages of a dual damascene interconnect fabrication sequence. FIG. 2A is a cross-sectional view of the substrate 200. The substrate 200 may be, for example, a silicon wafer and may include a conductive feature 240. As shown in FIG. 2B, a series of material layers are deposited on the substrate 200. Specifically, a lower barrier layer 202 is deposited over the substrate 200 (generally, comprising a dielectric such as SiOC) and the conductive feature 240. The lower barrier layer 202 is then treated with a plasma to improve adhesion of the layer 202 to the substrate 200. A lower low K dielectric layer 204 is subsequently deposited over the lower barrier layer 202. The lower barrier layer 202 may comprise, for example, a low K dielectric material such as a silicon carbide-based layer. The silicon carbide-based layer may further comprise hydrogen, oxygen, nitrogen, boron or phosphorus, or combinations thereof.

Silicon carbide-based layers that are suitable for use as the lower barrier layer 202 have a dielectric constant of about 3.2 or less, and may be deposited by introducing a processing gas comprising an organosilicon compound into a processing chamber, such as the PRODUCER plasma enhanced chemical vapor deposition chamber (PECVD) chamber, which is commercially available from Applied Materials, Inc. of Santa Clara, Calif.

The organosilane compound may comprise a phenyl group and may be, for example, diphenylsilane, dimethylphenylsilane, diphenylmethylsilane, or phenylmethylsilane. In one embodiment of the invention, the organosilicon compound has a formula $SiH_a(CH_3)_b(C_6H_5)_c$, wherein a is 0 to 3, b is 0 to 3, and c is 1 to 4. In an alternative embodiment, the organosilicon compound used for forming the lower barrier layer 202 has a similar formula wherein a is 1 or 2, b is 1 or 2, and c is 1 or 2. The processing gas may further include compounds having Si—O—Si bonding groups, such as organosiloxane compounds, compounds having Si—N—Si bonding groups, such as silazane compounds, and combinations thereof, for doping the deposited silicon carbide material with oxygen and nitrogen respectively. The lower barrier layer 202 may be doped with oxygen, boron, or phosphorous to reduce the dielectric constant of the deposited material. Compounds such as, for example, phosphine ($PH_3$) or borane ($BH_3$), or diborane ($B_2H_6$) may be introduced into the processing chamber during the deposition process in order to facilitate doping the film with boron or phosphorus. Furthermore, the lower barrier layer 202 may be oxygen doped using an oxygen-containing gas, for example, oxygen ($O_2$), ozone ($O_3$), nitrous oxide ($N_2O$), carbon monoxide (CO), carbon dioxide ($CO_2$), or combinations thereof.

The lower barrier layer 202 may be deposited to a thickness in a range of about 200 Å to about 1000 Å, and may be formed using a process such as a plasma enhanced chemical vapor deposition process. The lower barrier layer 202 may be deposited in one embodiment of the invention by supplying an organosilicon compound, such as diphenylsilane, to a plasma processing chamber at a flow rate between about 10 milligrams/minute (mgm) and about 1500 mgm, optionally supplying a dopant at a flow rate between about 10 sccm and about 2000 sccm, providing an inert gas at a flow rate between about 1 sccm and about 10000 sccm, maintaining a substrate temperature between about 100° C. and about 500° C., maintaining a chamber pressure below about 500 Torr, and an RF power of between about 0.03 watts/$cm^2$ and about 1500 watts/$cm^2$. Detailed methods suitable for depositing the lower barrier layer 202 are further described in co-pending U.S. patent application entitled, "A Method Of Depositing Low-K Barrier Layers," Ser. No. 10/010,950, filed Nov. 13, 2001, herein incorporated by reference in its entirety.

To improve adhesion of the lower barrier layer 202 to the underlying substrate (or an underlying sub-layer of, for example, SiOC), the lower barrier layer is treated with a plasma. In one embodiment, the lower barrier layer 202 is exposed to a hydrogen plasma $H_2$ plasma. The $H_2$ plasma is formed, for example, in a PRODUCER chamber at 400° C. with the pressure at 4 Torr, an RF power at 200 Watts and an $H_2$ flow rate of 400 sccm. For a lower barrier layer 202 of thickness 200 Å to 1000 Å, the treatment is applied for 10–30 seconds and, in one embodiment, for 10 seconds. The hydrogen plasma treatment can also be performed in a DxZ chamber available from Applied Materials, Inc. using 300° C., 10 Torr, and an RF power of below 1000 Watts A lower dielectric layer 204 is deposited over the lower barrier layer 202. The lower dielectric layer 204 comprises a low K dielectric material such as, for example, an organosilicate material, a porous oxide material, a silsesquioxane material, paralyne, a spin-on glass material such as un-doped silicon glass (USG), a fluorine-doped silicon glass (FSG) or combinations thereof. One example of an organosilicate-based low K dielectric layer is commercially available from Applied Materials, Inc., of Santa Clara, Calif. and sold under the trade name BLACK DIAMOND™.

In one embodiment of the invention, the lower low K dielectric layer 204 comprises silicon, oxygen, and carbon. The lower dielectric layer 204 may have a carbon content between about 5 and about 30 atomic percent (excluding hydrogen atoms), illustratively between about 5 and about 20 atomic percent, and may be deposited by providing a cyclic organosilicon compound, an aliphatic compound, and an oxidizing gas to a deposition chamber under conditions sufficient to form an ultra low dielectric constant film (K being less than 2.5). In such ultra low K materials the carbon content of the layer is generally greater than or equal to ten percent and/or the material has a porosity of greater than or equal to ten percent. The cyclic organosilicon compound may include a ring structure having three or more silicon atoms and the ring structure may further comprise one or more oxygen atoms. The aliphatic compound may include linear or branched (i.e. acyclic) organosilicon compounds having one or more silicon atoms and one or more carbon atoms and linear or branched hydrocarbon compounds having at least one unsaturated carbon bond. The oxidizing gas may comprise oxygen ($O_2$), ozone ($O_3$), nitrous oxide ($N_2O$), carbon monoxide (CO), carbon dioxide ($CO_2$), water ($H_2O$), peroxide ($H_2O_2$) or combinations thereof.

One or more meta-stable compounds may be added to the mixture described above to further reduce the dielectric constant of the deposited film. The meta-stable compound first forms an unstable component within the lower dielectric layer 204 during the deposition of the lower dielectric layer 204. The meta-stable compound then is removed from the lower dielectric layer 204 using an anneal treatment. The removal of the unstable component during the anneal treatment forms a void within the lower dielectric layer 204, leaving behind a film having a significantly lower dielectric constant. The meta-stable compound is also known as a "leaving group" because of the nature of the process whereby the meta-stable compound "leaves" the lower dielectric layer 204 to form one or more voids therein. Exemplary meta-stable compounds may include t-butylethylene, 1,1,3,3-tetramethylbutylbenzene, t-butylether, metylmethacrylate (MMA), and t-butylfurfurylether.

The lower dielectric layer 204 may be deposited to a thickness in a range of about 1000 to about 4000 Å. The lower dielectric layer 204 may be formed using a process such as a plasma enhanced chemical vapor deposition process.

In general, the following deposition process parameters may be used to form an organosilicate lower dielectric layer 204 using a CVD process chamber, such as the PRODUCER chamber commercially available from Applied Material, Inc. of Santa Clara, Calif. The process parameters range from a wafer temperature of about 50° C. to about 250° C., a chamber pressure of about 1 torr to about 500 torr, a TMS gas flow rate of about 600 sccm, an oxygen source gas flow rate of about 1000 sccm, an OMCTS flow rate of about 5000 mgm and an inert gas flow rate of about 1000 sccm. Helium (He), argon (Ar), nitrogen ($N_2$), or combinations thereof, among others, may be used to form the plasma 152. The above process parameters provide a deposition rate for the organosilicate layer in a range of about 0.1 micron/minute to about 2 microns/minute when implemented on a 200 mm (millimeter) substrate in a deposition chamber available from Applied Materials, Inc. Detailed methods suitable for depositing the lower dielectric layer 204 are described in commonly assigned U.S. patent application entitled, "Crosslink Cyclo-Siloxane Compound With Linear Bridging Group To Form Ultra Low K Dielectric," Ser. No. 10/121,284, filed Apr. 11, 2002, which is herein incorporated by reference in its entirety.

Figure 2C:
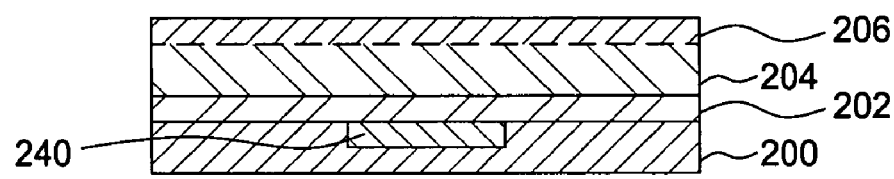

As shown in FIG. 2C, in one embodiment of the invention, the lower dielectric layer 204 is surface treated to harden a surface region of the lower dielectric layer 204, thereby forming a hardened dielectric portion 206 of the lower dielectric layer 204. The hardened dielectric portion 206 has etch properties that differ from an upper dielectric layer 208 (see FIG. 2D) formed atop the hardened dielectric portion 206. The surface treatment generally includes providing an inert gas including helium, argon, neon, xenon, or krypton, or combinations thereof, and/or a reducing gas including hydrogen, ammonia, or combinations thereof, to a processing chamber. The inert gas or reducing gas is introduced into the processing chamber at a flow rate between about 500 sccm and about 3000 sccm, and a plasma is generated in the processing chamber. The plasma may be generated using a power density ranging between about 0.03 watts/cm$^2$ and about 3.2 watts/cm$^2$, such as from a RF power level of between about 10 watts and about 1000 watts for a 200 mm substrate 200. The power level may be about 100 watts for a silicon carbide material on a 200 mm substrate. The RF power can be provided at a high frequency such as between 13 MHz and 14 MHz. The RF power may be provided continuously or in short duration cycles wherein the power is on at the stated levels for cycles less than about 200 Hz, and the on cycles total between about 10% and about 30% of the total cycle duration. The hardened dielectric portion 206 may be formed to a thickness in a range of about 300 Å to about 2000 Å. A detailed description of various techniques for treating the surface of the low K material to form an etch stop portion is contained in U.S. patent application Ser. No. 09/775,010, filed Jan. 31, 2001, which is hereby incorporated by reference in its entirety. By using such an in-situ process to form an etch stop portion, the deposition of a separate capping layer is not required as described in the prior art.

During the surface treatment, in one specific embodiment, the processing chamber may be maintained at a chamber pressure of between approximately 2 Torr and approximately 12 Torr, for example about 4 Torr, and hydrogen flows into the chamber at about 400 sccm. The substrate 200 is illustratively maintained at a temperature between approximately 100° C. and approximately 500° C. during the surface treatment. In one specific example, the temperature is maintained at 400° C. The surface treatment may be performed for a duration between approximately 10 seconds and approximately 100 seconds. The processing gas may be introduced into the chamber by a gas distributor, the gas distributor may be positioned between about 200 mils and about 800 mils from the substrate surface. The showerhead may be positioned between about 300 mils and about 600 mils during the surface treatment.

In an alternative embodiment, the surface of the lower low K dielectric layer 204 is not hardened. As such, step 106 is considered optional as indicated by a dashed box in FIG. 1.

Figure 2D:
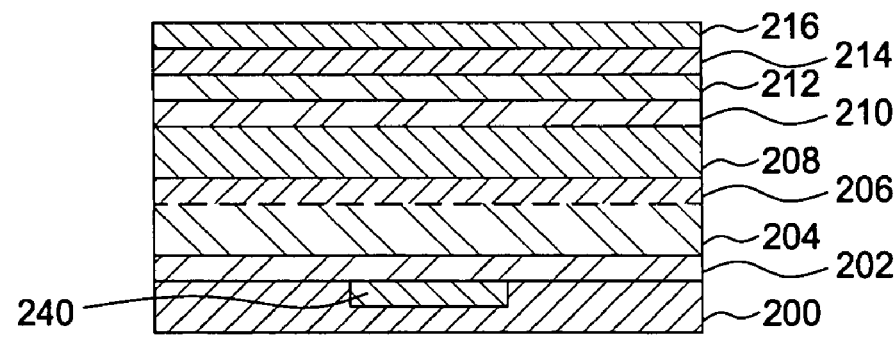

As shown in FIG. 2D, upper dielectric layer 208 is deposited over the hardened dielectric portion 206. The upper dielectric layer comprises a low K dielectric material and may be formed to a thickness and may have a composition similar to the lower low K dielectric layer 204. An etch stop layer 210 (or a second barrier layer) is deposited over the second low K dielectric layer 208. The etch stop layer 210 may comprise, for example, silicon nitride, a nitrogen-doped silicon carbide material, an oxygen-doped silicon carbide material, among other materials that may etch at a rate that is different from that of the lower dielectric layer 204 or different from subsequently formed layers atop the etch stop layer 210, when exposed to an etchant. In one embodiment of the invention, the etch stop layer 210 may have a similar composition to the lower barrier layer 202 and may be formed in a similar manner to the lower barrier layer 202. In another embodiment of the invention, the etch stop layer 210 may be formed by surface treating the upper low K dielectric layer 208 to form the etch stop layer 210 in manner similar to the hardening process described above with reference to the hardened dielectric layer 206. The etch stop layer 210 may have a thickness of about 200 Å to about 1000 Å.

A hard mask layer 212 is deposited atop the etch stop layer 210. The hard mask layer 212 generally comprises a material that has good etch selectivity with respect to the etch stop layer 210 and with respect to the second dielectric layer 208. The hard mask layer 212 may comprise a conductive material such as a metal or metal nitride. The hard mask layer 212 may comprise a refractory metal nitride such as a material selected from the group consisting of titanium nitride, tantalum nitride, and tungsten nitride or a refractory metal such as tungsten or titanium. The hard mask layer 212 could also be formed of amorphous silicon. The hard mask layer 212 may be deposited to a thickness in a range of about 300 to about 1500 Angstroms. The hard mask layer 212 may be deposited using, for example, a physical vapor deposition (PVD) process wherein a refractory metal such as titanium, tantalum, or tungsten is sputtered. Alternatively the sputtering process can occur in a nitrogen atmosphere to form a metal-nitride hard mask material. An amorphous silicon hard mask may be deposited using PVD or CVD techniques.

Figure 2E:
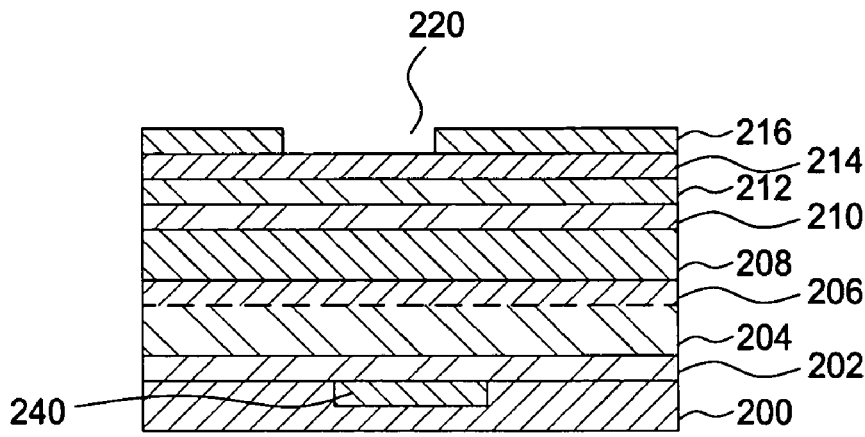

Referring to FIG. 2E, a trench pattern 220 is formed in the hard mask layer 212. The formation of the trench pattern 220 may comprise depositing a first photoresist layer 216 (shown in FIG. 2D) atop a bottom antireflection coating (BARC) layer 214 that is formed atop the hard mask layer 212. The BARC layer 214 is positioned between the photoresist layer 214 and the hard mask layer 212 in order to control reflections from the underlying second conductive layer 210. A BARC layer reduces the tendency of inaccuracies from developing when the pattern is transferred from the photoresist layer 216. The BARC layer 214 may comprise, for example, organic materials such as polyamides and polysulfones, or inorganic materials such as silicon nitride, silicon oxynitride, silicon carbide, and the like. The BARC layer 214 and the first photoresist layer 216 together have a combined thickness of about 6000 Angstroms.

Figure 2F:
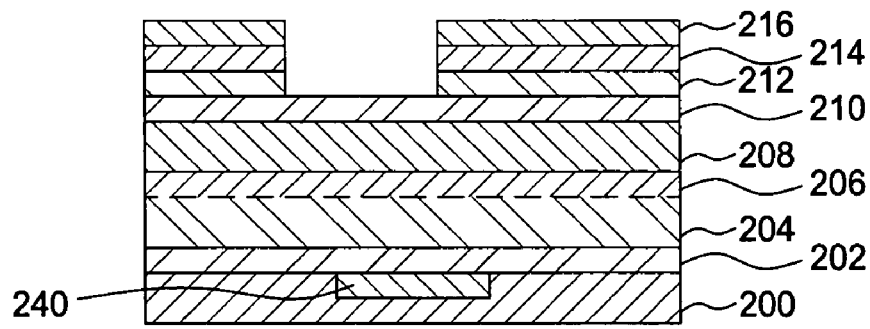

Referring to FIG. 2F, the photoresist is used in a well known manner to define the trench pattern 220 in the hard mask 212. To reduce the number of process chambers involved in the formation of the dual damascene structure, the present invention uses a dielectric etch chamber to etch both the hard mask (a metal, metal-nitride, or amorphous silicon material) and the low K dielectric. Such a chamber is described in reference to FIG. 4, below. To etch a metal or metal-nitride hard mask, an etchant for metal is used. For example, if the hard mask 212 is made of TiN, then a chlorine chemistry is used. Alternatively, if the hard mask is tungsten, then a $SF_6$ chemistry is used. For an amorphous silicon hard mask, the chemistry is generally fluorine-based. Generally, during etch of the hard mask, a low bias power is used to enhance the selectivity of the etch to the low K dielectric. The specific process parameters for etching these forms of hard mask materials are well known in the art.

Figure 2G:
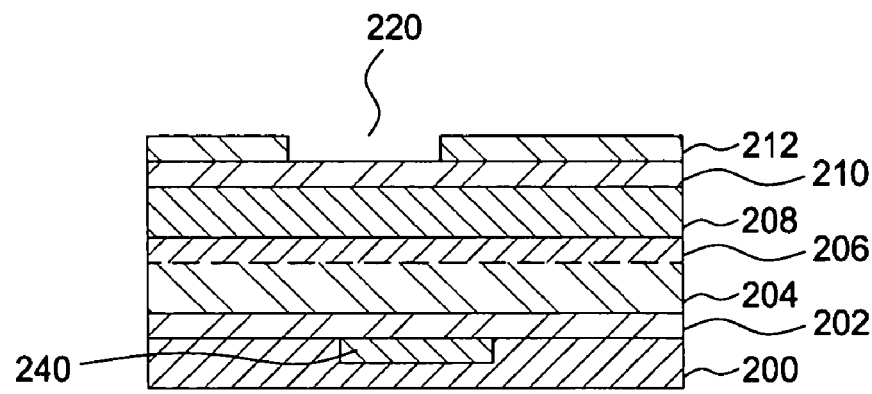

Referring to FIG. 2G, the first photoresist layer 216 is removed (i.e. stripped) by contacting the first photoresist layer 216 with, for example, an oxygen-based plasma. The stripping may comprise flowing an oxygen-based gas such as oxygen or ozone and an inert gas such as nitrogen into a chamber such as an Advanced Strip and Passivation Chamber (ASP) or AXIOM chamber, commercially available from Applied Materials Inc, of Santa Clara, Calif. A source power of about 2 kW may be applied to an antenna to ignite the oxygen-based gas into a plasma. The chamber may be maintained at a pressure of about 5 to 150 mTorr and at a temperature between about 20° C. to about 400° C. Alternatively, removal of the photoresist can be performed in an etch chamber.

Figure 2H:
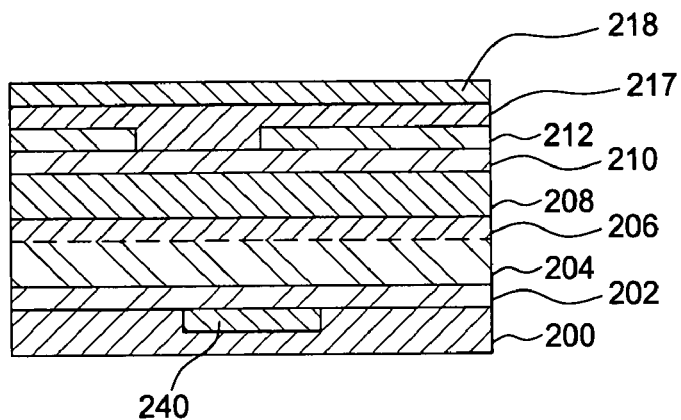

Referring to FIG. 2H, a second photoresist layer 218 is deposited similarly to the first photoresist layer 214. A BARC layer 217 is deposited upon the mask 212 and the opening in the mask 212. The BARC layer 217 is deposited to a thickness that the surface is planar, i.e., the BARC layer 217 is used to planarize the surface of the film stack. Then, the photoresist material 218 is deposited upon the BARC layer 218 in the same manner as described above for depositing the first photoresist layer 216. The BARC layer 217 may comprise, for example, organic materials such as polyamides and polysulfones, or inorganic materials such as silicon nitride, silicon oxynitride, silicon carbide, and the like. Once the BARC layer 217 and photoresist layer 218 are deposited, they are patterned in a conventional manner to define the location and size of one or more vias.

If the patterning process has misaligned the via opening 222 such that the opening 222 overlaps the hard mask 212, the invention provides a realignment procedure for the via and trench. FIGS. 2G, 2H, 2I, 2J and 2K depict the mask as misaligned, i.e., the trench opening is not centered above the conductor 240. If misalignment occurs where mask portion 250 protrudes into opening 222, the etch chamber will be used to etch the hard mask from the opening 212. As such, a conventional metal or metal-nitride etch chemistry is used in, for example, the dielectric etch chamber of FIG. 4 to remove mask portion 250 and correct the misalignment. Thus, a substrate that is processed according to the invention will produce operational circuits where, in the prior art, the misalignment may result in a useless substrate.

Figure 2I:
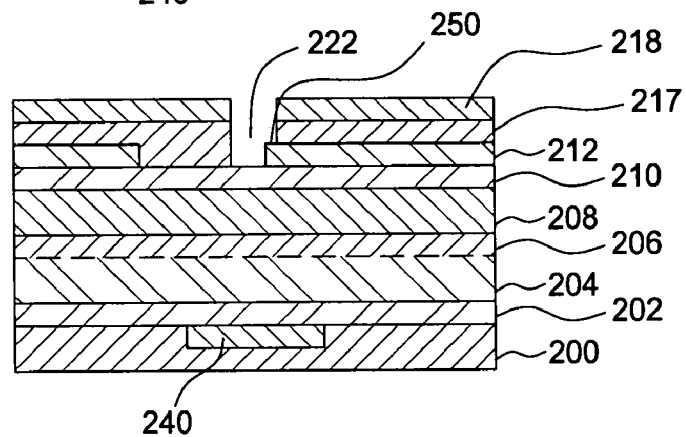
Figure 2J:
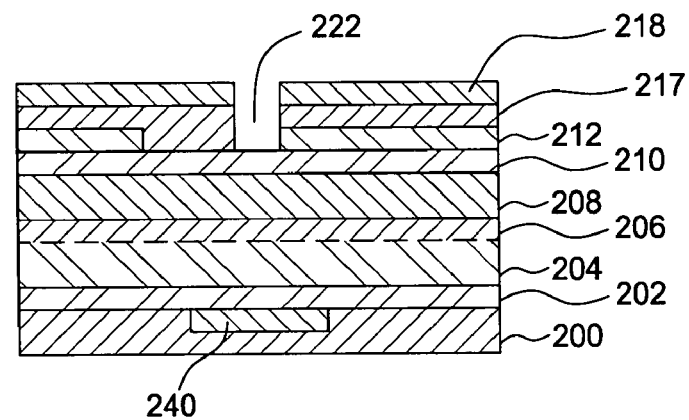
Figure 2K:
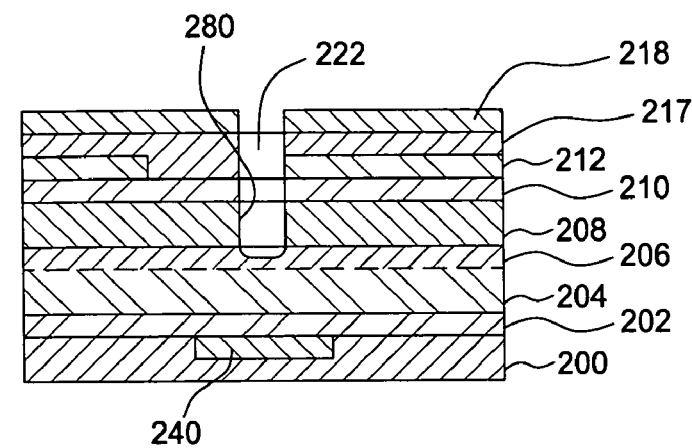

As shown in FIG. 2I, the pattern for the via 222 formed in the second photoresist layer 218 defines a region of the etch stop layer 210 and the upper dielectric layer 208 to be etched. The etching process may continue until the hardened dielectric portion 206 is etched partially or completely through, as shown in FIG. 2K. The upper dielectric layer 208 and portions of the hardened dielectric portion 206 of the lower low K dielectric layer 204 may be etched using, for example, a plasma comprising one or more chemical species such as fluorine, carbon, and oxygen ions. The plasma may further comprise a nitrogen-species, and/or a hydrogen species.

The etching of the upper dielectric layer 208 may comprise supplying at least about 500 sccm of Argon, between about 4 and about 400 sccm of $CF_4$, between about 0 and about 200 sccm of $CH_2F_2$. About 0 to about 400 sccm of N2 applying a source power to the upper electrode 128 between 100 and 300 Watts, applying a bias power between about 1500 and 3000 Watts to the pedestal 116, and maintaining a substrate temperature between −−20 and 30 degrees Celsius as well as a pressure in the reactor between 10 and 250 mTorr. One specific process recipe provides 2000 sccm of Ar, 20 sccm of $CH_2F_2$, 40 sccm of $CF_4$, 40 sccm of $N_2$, applying 200 Watts to the upper electrode 128 and 2000 Watts to the pedestal 416, maintaining a substrate temperature of about 20° Celsius, and maintaining a pressure in the reactor of about 100 mTorr.

Figure 2L:
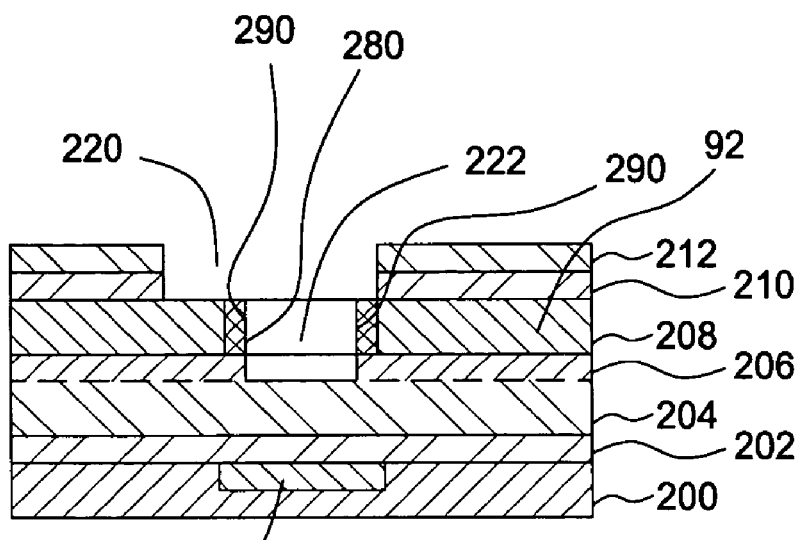

As shown in FIG. 2L, the second photoresist layer 218 is stripped using a process that may be similar to the process described above with reference to FIG. 2G. As a result of the stripping of the second photoresist layer 218, a surface region 290 of the upper dielectric layer 208 is generally damaged. The damage may result from, for example, an interaction between the oxygen plasma used to strip the photoresist layer 218 and the upper dielectric layer 208. Specifically, the upper dielectric layer 208 may undergo a "k-loss" in which the dielectric constant of the upper dielectric layer 208 increases in the vicinity of the damaged region 290 relative to a bulk region 292 of the upper dielectric layer 208, which is not substantially affected by the oxygen plasma.

The damaged region 290 may be characterized as having a higher concentration of hydrogen, a higher concentration of oxygen, a lower concentration of carbon, a lower concentration of silicon, or combinations thereof with respect to the bulk region 292 of the upper dielectric layer 208. The damaged region 290 may have a thickness in a range of about 100 Å to about 600 Å.

Figure 2M:
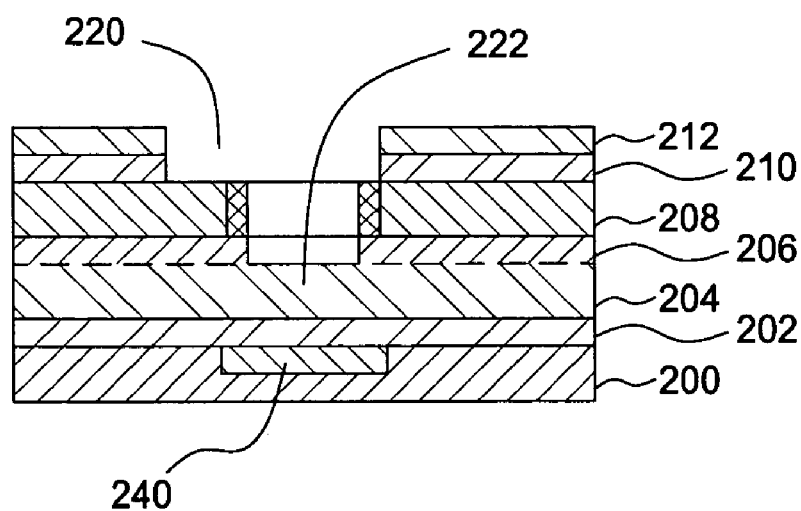

Using an etchant similar to the etchant gases used to extend the via 222 into the hardened dielectric portion 206, as discussed above with reference to FIG. 2K, the trench pattern 220 is extended through the etch stop layer 210, using the hard mask layer 212 as a mask, stopping on the upper dielectric layer 208. Simultaneously the via 222 is extended completely through the hardened dielectric portion 206. The via 222 may be extended partially into the lower dielectric layer 204, as shown in FIG. 2M.

The hard mask layer 212 facilitates etching since it provides a high degree of etch selectivity with respect to the layers comprising low K materials (i.e., the etch stop layer 210, the hardened dielectric portion 206, the upper dielectric layer 208, the lower dielectric layer 204, and the lower barrier layer 202). Furthermore, in embodiments in which the hard mask layer 212 is electrically conductive, the hard mask layer 212 is not subject to electrostatic charging from the plasma used to etch the etch stop layer 210 and the hardened dielectric layer 206. As a result, the hard mask layer 212 is less apt to cause microtrenching and non-uniform etching profiles during the etching of the various material layers.

Figure 2N:
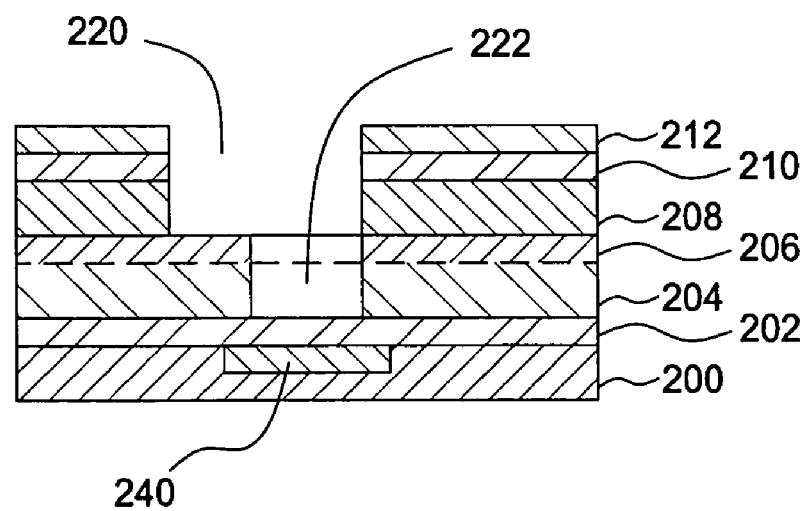

Thereafter, as shown in FIG. 2N, the trench pattern 220 is formed in the upper dielectric layer 208 using the hard mask layer 212 as a mask stopping on the hardened dielectric portion 206 and the via 222 is simultaneously extended into the lower dielectric layer 204 using the hardened dielectric portion 206 as a mask, stopping on the lower barrier layer 202. The simultaneous etching of the lower and upper dielectric layers 204 and 208 may comprise supplying at least about 500 sccm of Argon, between about 4 and about 400 sccm of $CF_4$, between about 0 and about 200 sccm of $CH_2F_2$. About 0 to about 400 sccm of $N_2$ applying a source power to the upper electrode 128 between 100 and 300 Watts, applying a bias power between about 400 and 2500 Watts to the pedestal 116, and maintaining a substrate temperature between −20 and 30 degrees Celsius as well as a pressure in the reactor between 10 and 250 mTorr. One specific process recipe provides 200 sccm of Ar, 150 sccm of $CF_4$, 60 sccm of $N_2$, applying 300 Watts to the upper electrode 128 and 1200 Watts to the pedestal 416, maintaining a substrate temperature of about 20° Celsius, and maintaining a pressure in the reactor of about 200 mTorr.

Figure 2O:
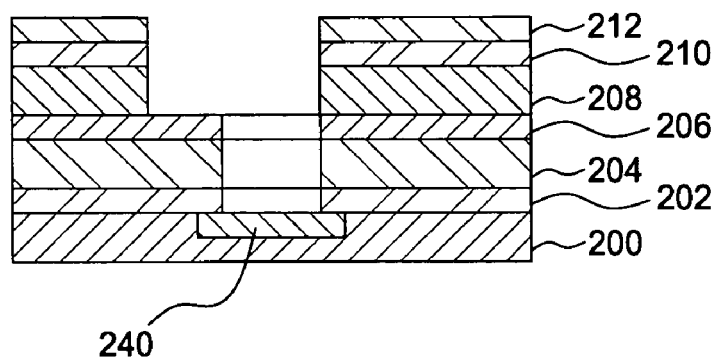

As shown in FIG. 2O, the lower barrier layer 202 may be etched to expose the conductive feature 240.

Figure 2P:
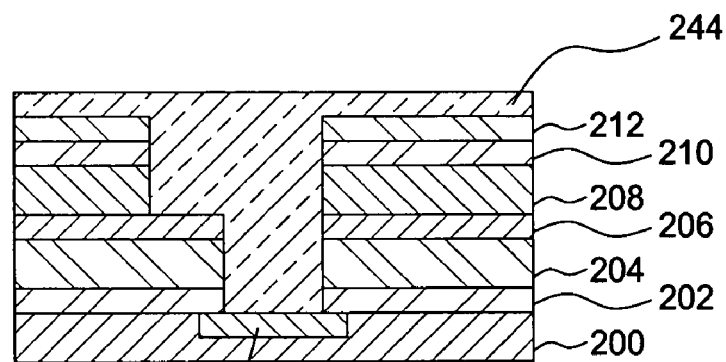
Figure 2Q:
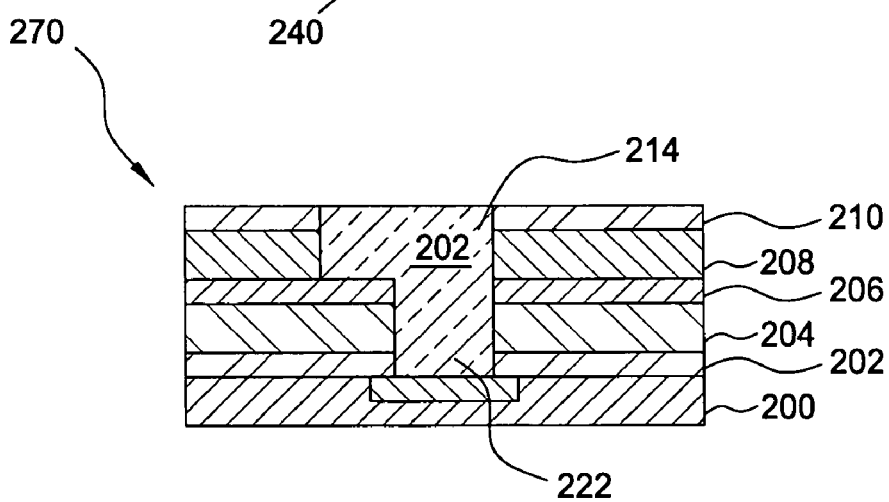

Thereafter, a conductive layer 244 such as a copper layer is deposited in the trench 220 and the via 222 as shown in FIG. 2P. A barrier layer such as TiN or TaN may be deposited on the structure prior to the metal deposition. The conductive layer 244 is planarized using, for example, a chemical mechanical planarization process, an electrochemically assisted chemical mechanical planarization, or a like process, as shown in FIG. 2Q, thereby forming an interconnect structure 270. The hard mask 212 may be removed during the planarization process.

In an alternative embodiment of the invention, a dual damascene interconnect structure is fabricated without the etch stop layer 210 (i.e., the hard mask layer 212 is deposited directly on the upper dielectric layer 208). As such, the hard mask 212 is patterned using the upper low K dielectric layer 208 as an etch stop. After patterning the hard mask, the process of forming the dual damascene structure is the same as described above.

Etch processes that may be used to form the dual damascene structures of the present invention may be practiced, for example, in a dual frequency capacitive plasma source reactor. The dual frequency capacitive plasma source reactor may be included in a processing system such as the CENTURA® semiconductor wafer processing system commercially available from Applied Materials, Inc. of Santa Clara, Calif. The reactor is discussed in detail with respect to FIG. 3 below. The reactor is adapted for processing 300 mm wafers, operates in broad ranges of the process parameters and etchant chemistries, may use an endpoint detection system, and has in-situ self-cleaning capabilities. In one embodiment, the reactor uses a 160 MHz plasma source to produce a high density plasma, a 13.56 MHz wafer bias source and a plasma magnetizing solenoid, such that the reactor provides independent control of ion energy, plasma density and uniformity, and wafer temperature. A detailed description of a suitable dual frequency capacitive plasma source reactor is provided in U.S. patent application Ser. No. 10/192,271, filed Jul. 9, 2002 which is commonly assigned to Applied Materials, Inc., and is herein incorporated by reference in its entirety.

Figure 3:
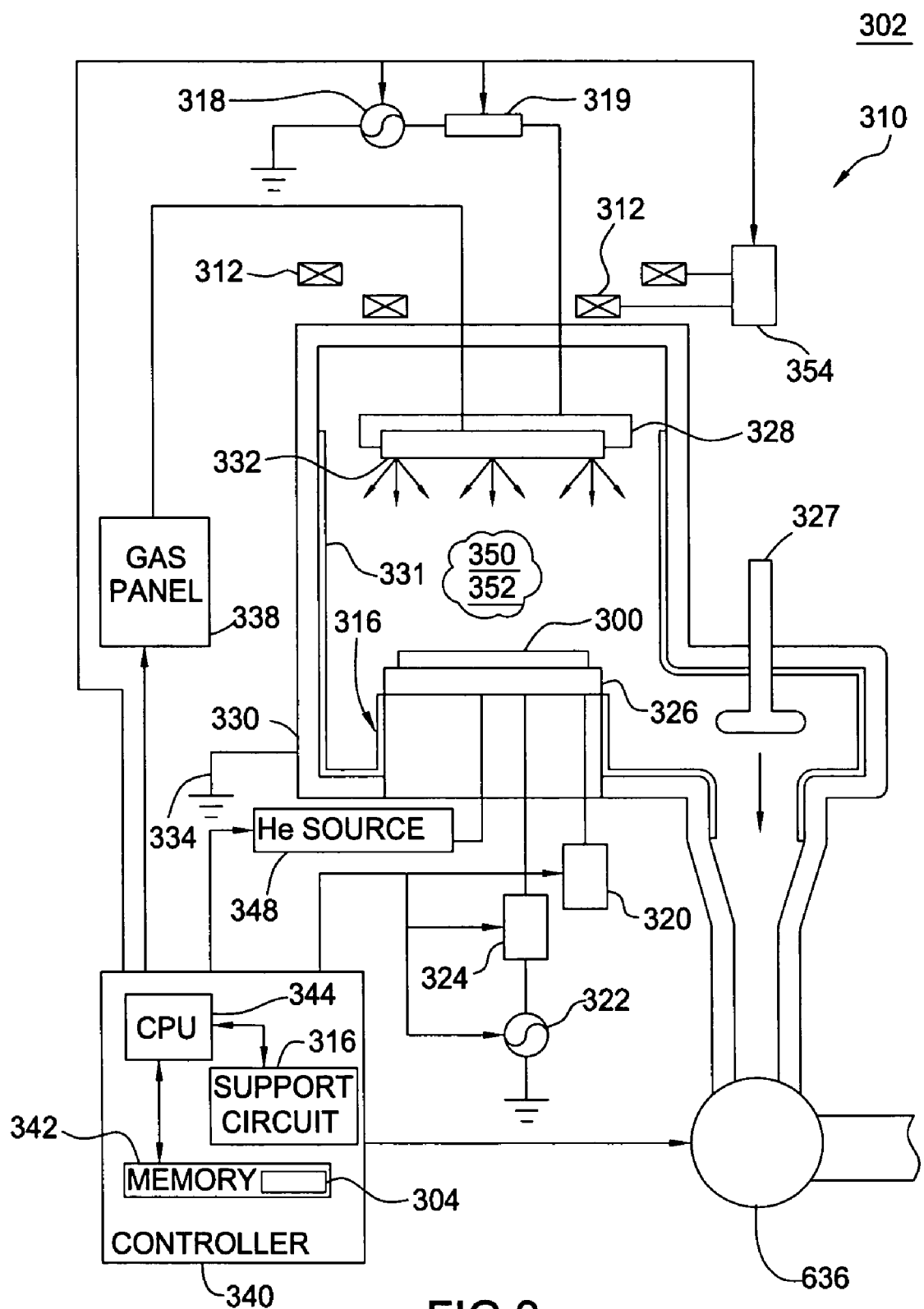
FIG. 3 is a schematic diagram of a plasma processing apparatus that may be used to practice embodiments of the invention described herein.

FIG. 3 depicts a schematic, cross-sectional diagram of a dual frequency capacitive plasma source reactor that may be used to practice the present invention. A reactor 302 comprises a process chamber 310 having a conductive chamber wall 330 that is connected to an electrical ground 334 and at least one solenoid segment 312 positioned exterior to the chamber wall 330. The chamber wall 330 comprises a ceramic liner 331 that facilitates cleaning of the chamber 310. The byproducts and residue of the etch process are readily removed from the liner 331 after each wafer is processed. The solenoid segment(s) 312 are controlled by a DC power source 354 that is capable of producing at least 5 V. Process chamber 310 also includes a wafer support pedestal 316 that is spaced apart from a showerhead 332. The wafer support pedestal 316 comprises an electrostatic chuck 326 for retaining a substrate 300 beneath the showerhead 332. The showerhead 332 may comprise a plurality of gas distribution zones such that various gases can be supplied to the chamber 310 using a specific gas distribution gradient. The showerhead 332 is mounted to an upper electrode 328 that opposes the support pedestal 316. The electrode 328 is coupled to an RF source 318.

The electrostatic chuck 326 is controlled by a DC power supply 320 and the support pedestal 316, through a matching network 324, which is coupled to a bias source 322. Optionally, the source 322 may be a DC or pulsed DC source. The upper electrode 328 is coupled to a radio-frequency (RF) source 318 through an impedance transformer 319 (e.g., a quarter wavelength matching stub). The bias source 322 is generally capable of producing a RF signal having a tunable frequency of 50 kHz to 13.56 MHz and a power of between 0 and 5000 Watts. The source 318 is generally capable of producing a RF signal having a tunable frequency of about 160 MHz and a power between about 0 and 2000 Watts. The interior of the chamber 310 is a high vacuum vessel that is coupled through a throttle valve 327 to a vacuum pump 336. Those skilled in the art will understand that other forms of the plasma etch chamber may be used to practice the invention, including a reactive ion etch (RIE) chamber, an electron cyclotron resonance (ECR) chamber, and the like.

In operation, a substrate 300 is placed on the support pedestal 316, the chamber interior is pumped down to a near vacuum environment, and a gas 350 (e.g., argon), when ignited produces a plasma, is provided to the process chamber 310 from a gas panel 338 via the showerhead 332. The gas 350 is ignited into a plasma 352 in the process chamber 310 by applying the power from the RF source 318 to the upper electrode 328 (anode). A magnetic field is applied to the plasma 352 via the solenoid segment(s) 312, and the support pedestal 316 is biased by applying the power from the bias source 322. During processing of the substrate 300, the pressure within the interior of the etch chamber 310 is controlled using the gas panel 338 and the throttle valve 327.

In one embodiment of the invention, the temperature of the chamber wall 330 is controlled using liquid-containing conduits (not shown) that are located in and around the wall. Further, the temperature of the substrate 300 is controlled by regulating the temperature of the support pedestal 316 via a cooling plate (not shown) having channels formed therein for circulating a coolant. Additionally, a back side gas (e.g., helium (He) gas) is provided from a gas source 348 into channels, which are formed by the back side of the substrate 300 and the grooves (not shown) in the surface of the electrostatic chuck 326. The helium gas is used to facilitate a heat transfer between the pedestal 316 and the substrate 300. The electrostatic chuck 326 is heated by a resistive heater (not shown) within the chuck body to a steady state temperature and the helium gas facilitates uniform heating of the substrate 300. Using thermal control of the chuck 326, the substrate 300 is maintained at a temperature of between 10 and 500 degrees Celsius.

A controller 340 may be used to facilitate control of the chamber 310 as described above. The controller 340 may be one of any form of a general purpose computer processor used in an industrial setting for controlling various chambers and sub-processors. The controller 340 comprises a central processing unit (CPU) 344, a memory 342, and support circuits 346 for the CPU 344 and coupled to the various components of the etch process chamber 310 to facilitate control of the etch process. The memory 342 is coupled to the CPU 344. The memory 342, or computer-readable medium, may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. A software routine 304, when executed by the CPU 344, causes the reactor to perform processes of the present invention and is generally stored in the memory 342. The software routine 304 may also be stored and/or executed by a second CPU (not shown) that is remotely located from the hardware being controlled by the CPU 344.

The software routine 304 is executed after the substrate 300 is positioned on the pedestal 316. The software routine 304, when executed by the CPU 344, transforms the general purpose computer into a specific purpose computer (controller) 340 that controls the chamber operation such that the etching process is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

While foregoing is directed to embodiments of the present invention, other and further embodiments of the invention may be devised without departing from the basic scope thereof, and the scope thereof.

The invention claimed is:

1. A method of forming a low K interconnect structure, comprising:
providing a film stack comprising a lower low K dielectric layer having a hardened top portion, an upper low K dielectric layer, an etch stop layer and a hard mask;
patterning the hard mask to define a trench;
depositing and patterning a photoresist layer that defines a via within the trench;
etching the via into the upper low K dielectric layer and the hardened top portion of the lower low K dielectric layer;
stripping the photoresist layer; and
etching a trench into the upper low K dielectric layer as defined by the hard mask while simultaneously etching a via into the lower low K dielectric layer using the hardened portion as a mask for the via.

2. The method of claim 1 wherein the stripping of the photoresist layer is performed prior to etching the trench in the upper low K dielectric layer and the via in the lower low K dielectric layer to ensure that the upper and lower low K dielectric layers are not damaged by the photoresist layer stripping.

3. The method of claim 1 wherein the upper low K dielectric layer comprises silicon, carbon, and oxygen.

4. The method of claim 3 wherein the upper and lower low K dielectric layers have a carbon content of greater than or equal to 10 percent.

5. The method of claim 1 wherein the hard mask is patterned using a chlorine-based chemistry and the upper and lower low K dielectric layers are etched using a fluorine-based chemistry.

6. The method of claim 1 wherein the hardened top portion of the lower low K dielectric layer is formed by plasma treating a silicon-based dielectric material.

7. The method of claim 6 wherein the plasma treating uses at least one of helium, argon, xenon, and krypton.

8. The method of claim 6 wherein the plasma treating uses a reducing gas.

9. The method of claim 1 wherein the hard mask layer comprises a material selected from the group consisting of refractory metal nitrides and metallic materials.

10. The method of claim 1 wherein the steps of etching a via and etching a trench are performed in a dual frequency capacitive plasma etch chamber.

11. The method of claim 1 further comprising filling the via and the trench with a metal.

12. The method of claim 1 wherein said step of depositing and patterning the photoresist layer further comprises:
   depositing an antireflective coating layer within the trench and atop the hard mask until a top surface of the antireflective coating layer is substantially planar; and
   depositing the photoresist layer atop the antireflective coating layer.

13. The method of claim 12 further comprising depositing a conductive material into the via and trench.

14. A method of etching a low K material comprising:
   hardening a portion of a low K material;
   patterning the hardened portion to form at least one opening to low K material that is unhardened;
   etching the unhardened low K material in the at least one opening to form at least one trench;
   depositing an antireflective coating layer in the at least one opening and atop the layer until a top surface of the antireflective coating layer is substantially planar;
   depositing a mask atop the antireflective coating material; and
   patterning the mask material to define a via, wherein the trench and via form a dual damascene structure.

15. The method of claim 14 wherein the low K material is organosilicate glass having a carbon content of greater than or equal to ten percent.

16. The method of claim 14 wherein the hardening step comprises:
   exposing a surface of the low K material to a plasma comprising at least one of helium, argon, xenon and krypton.

17. The method of claim 14 wherein the hardening step comprises:
   exposing the surface to a reducing gas.

18. The method of claim 14 wherein the mask material is a photoresist material.

19. The method of claim 14 wherein the opening is at least one of a via or a trench.

20. A method of forming a low K interconnect structure, comprising:
   providing a film stack comprising a lower low K dielectric, an upper low K dielectric layer, and a hard mask;
   patterning the hard mask to define a trench;
   depositing and patterning a photoresist layer that defines a via within the trench;
   etching the via into the upper low K dielectric layer and a portion of the lower low K dielectric layer;
   stripping the photoresist layer; and
   etching a trench into the upper low K dielectric layer as defined by the hard mask while simultaneously etching a via into the lower low K dielectric layer.

21. The method of claim 20 wherein the lower low K dielectric layer has a hardened top surface that forms a mask for the via etched into the lower low K dielectric layer.

22. The method of claim 21 wherein the hardened top surface of the lower low K dielectric layer is formed by plasma treating a silicon-based dielectric material.

23. The method of claim 22 wherein the plasma treating uses at least one of helium, argon, xenon, and krypton.

24. The method of claim 23 wherein the plasma treating uses a reducing gas.

25. The method of claim 20 wherein an etch stop layer is located beneath the hard mask.

26. The method of claim 20 wherein the stripping of the photoresist layer is performed prior to etching the trench in the upper low K dielectric layer and the via in the lower low K dielectric layer to ensure that the upper and lower low K dielectric layers are not damaged by the photoresist layer stripping.

27. The method of claim 20 wherein the upper low K dielectric layer comprises silicon, carbon, and oxygen.

28. The method of claim 20 wherein the upper and lower low K dielectric layers have a carbon content of greater than or equal to 10 percent.

29. The method of claim 20 wherein the hard mask is patterned using a chlorine-based chemistry and the upper and lower low K dielectric layers are etched using a fluorine-based chemistry.

30. The method of claim 20 wherein the hard mask layer comprises a material selected from the group consisting of refractory metal nitrides and metallic materials.

31. The method of claim 20 wherein the steps of etching a via and etching a trench are performed in a dual frequency capacitive plasma etch chamber.

32. The method of claim 20 further comprising filling the via and the trench with a metal.

33. The method of claim 20 wherein said step of depositing and patterning the photoresist layer further comprises:
   depositing an antireflective coating layer within the trench and atop the hard mask until a top surface of the antireflective coating layer is substantially planar; and
   depositing the photoresist layer atop the antireflective coating layer.

34. The method of claim 33 further comprising depositing a conductive material into the via and trench.

* * * * *

UNITED STATES PATENT AND TRADEMARK OFFICE
CERTIFICATE OF CORRECTION

| | |
|---|---|
| PATENT NO. | : 7,132,369 B2 |
| APPLICATION NO. | : 10/745344 |
| DATED | : November 7, 2006 |
| INVENTOR(S) | : Delgadino et al. |

It is certified that error appears in the above-identified patent and that said Letters Patent is hereby corrected as shown below:

On the face page, in field (75), in "Inventors", in column 1, line 7: delete "Lihua Li," and insert -- Lihua Li Huang, --, therefor.

In column 9, line 15, delete "– –20" and insert -- –20 --, therefor.

Signed and Sealed this

Twenty-second Day of May, 2007

JON W. DUDAS
*Director of the United States Patent and Trademark Office*